US006956362B1

(12) United States Patent
Campbell et al.

(10) Patent No.: US 6,956,362 B1
(45) Date of Patent: Oct. 18, 2005

(54) MODULAR ACTIVE TEST PROBE AND REMOVABLE TIP MODULE THEREFOR

(75) Inventors: Julie A. Campbell, Beaverton, OR (US); Lawrence W. Jacobs, Beaverton, OR (US); Stephen Mark Sekel, Camas, WA (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/321,408

(22) Filed: Dec. 16, 2002

Related U.S. Application Data

(60) Provisional application No. 60/340,495, filed on Dec. 14, 2001.

(51) Int. Cl.[7] .............................................. G01R 1/06
(52) U.S. Cl. ................................... 324/72.5; 324/754
(58) Field of Search .............................. 324/754, 72.5, 324/149, 121 R

(56) References Cited

U.S. PATENT DOCUMENTS

| | | | | |
|---|---|---|---|---|
| 2,849,681 A | * | 8/1958 | Belart | .......................... 324/149 |
| 2,857,572 A | * | 10/1958 | Belart | .......................... 324/149 |
| 4,139,817 A | * | 2/1979 | Boer et al. | .................. 324/72.5 |
| 4,161,692 A | * | 7/1979 | Tarzwell | ..................... 324/754 |
| 4,504,780 A | | 3/1985 | Marsella | |
| 4,672,306 A | | 6/1987 | Thong | |
| 4,845,649 A | | 7/1989 | Eckardt et al. | |
| 4,853,627 A | * | 8/1989 | Gleason et al. | ............. 324/754 |
| 4,858,615 A | | 8/1989 | Meinema | |
| 4,891,585 A | * | 1/1990 | Janko et al. | ................. 324/754 |
| 5,105,148 A | | 4/1992 | Lee | |
| 5,218,293 A | * | 6/1993 | Kan | ............................ 324/761 |
| 5,691,635 A | | 11/1997 | Pot et al. | |
| 5,729,150 A | * | 3/1998 | Schwindt | ..................... 324/762 |
| 5,898,299 A | * | 4/1999 | Fodali | ......................... 324/149 |
| 6,232,764 B1 | | 5/2001 | Rettig et al. | |
| 6,242,903 B1 | | 6/2001 | Klingberg et al. | |
| 6,688,906 B2 | | 2/2004 | Kimbley | |
| 6,704,670 B2 | | 3/2004 | McTigue | |
| 6,768,328 B2 | * | 7/2004 | Self et al. | .................... 324/754 |

* cited by examiner

*Primary Examiner*—Ernest Karlsen
(74) *Attorney, Agent, or Firm*—Karen Dana Oster

(57) ABSTRACT

A modular active test probe and removable tip module therefor. Within the scope of the invention, there is a probe tip module comprising a first probe tip adapted for probing a circuit under test to receive a signal therefrom. The probe tip module includes an amplifier having a first input solidly connected to the probe tip, an output connected to an output connector, and a housing for supporting the probe tip, the amplifier, and the output connector. A probe body is cooperatively adapted with the housing for repeatably removably receiving at least the output connector.

26 Claims, 7 Drawing Sheets

MODULAR ACTIVE TEST PROBE AND REMOVABLE TIP MODULE THEREFOR

This application claims the benefit of the provisional application Ser. No. 60/340,495 filed Dec. 14, 2001, entitled Modular Active Electrical Testing Probe, which is incorporated by reference in its entirety.

BACKGROUND OF INVENTION

The present invention relates generally to a modular active test probe and a removable tip module therefor that optimizes test probe performance.

Test probes are particularly critical to the accurate measurement of signals. As is well known, test probes are used to make temporary connections between a circuit test point and a measuring instrument, such as an oscilloscope. The primary goal when measuring a signal is to obtain as accurate a measurement as possible without disturbing the operation of the circuit. Specifically, the goal is to sample a signal without unduly loading the circuit while maximizing signal fidelity. For purposes herein, signal fidelity refers to the accuracy with which the signal that would be present at an unloaded test point is transmitted to the measuring apparatus and is achieved by, among other things, minimizing signal attenuation, maximizing bandwidth, providing constant time delay with increasing frequency, and minimizing ringing, signal reflection, and other types of signal distortion. To design a test probe that is capable of satisfying this goal, the properties of the test probe, the probe cable, and the measuring instrument must be considered together.

It is also important when measuring signals to have a test probe that is adapted to specific measurement needs. First, different test instruments have different input requirements, e.g., bandwidth, input resistance, and input capacitance and the test probe and probe cable used with a particular test instrument should be compatible with these requirements. Second, different test probes are adapted for sampling different test conditions. Voltage probes may be adapted for measuring high frequency or differential signals. Test probes may be adapted to the specific geometries or electrical characteristics of the circuit being tested. For example, some circuits now employ a standard connector for attaching a test probe. Moreover, test probes may be adapted to measure different types of signals, such as current or optical signals.

Test probes typically include a probe tip that makes physical contact with the test point, a probe body that allows the test probe to be held and which also holds the probe tip and probe circuit components, and a probe cable used to couple the test probe to the test instrument. An active test probe additionally includes a high input impedance amplifier to provide high signal fidelity while minimizing loading of the circuit.

Typically, the probe body and probe tip are integral. However, in some test probes, the probe tip can be removed from the probe body and replaced with another probe tip. A removable probe tip is desirable for several reasons: (a) different types of probe tips are required or may be advantageous for different test conditions; (b) the use of a single probe and several removable probe tips of different types is less expensive and more convenient than using several different complete test probe assemblies; and (c) if the removable probe tip breaks, it is less expensive to replace the probe tip rather than the complete test probe assembly. Though removable probe tips are desirable, they suffer from a number of disadvantages.

As mentioned, the design of a test probe capable of sampling a signal without unduly loading the circuit while maximizing signal fidelity requires that the test probe, probe cable, and test instrument properties be considered together. For example, the circuit elements in an active test probe are typically designed to optimize the performance of a probe tip having a particular geometry. However, these same circuit elements will not provide optimal performance when a probe tip having a different geometry is substituted. In other words, a test probe may be designed to optimize the signal fidelity for a single probe tip, but signal fidelity will not be optimal if the test probe is used with a number of different probe tips.

Other disadvantages of removable probe tips arise from the fact that removable tips require at least one (and typically more than one) removable connection or connector in the signal path. The connectors are needed to mechanically join and electrically couple the probe body and the probe tip. One common type of electrical connector is a socket on the probe body that receives the probe tip. Within the socket is a pliant spring or elastomer that compresses to receive and engage the probe tip after it has been inserted. The socket, the probe tip, and spring are all made from conductive material, such as metal. The socket is coupled to probe circuitry within the probe body and electrically couples the probe circuitry with the probe tip. In another common type of electrical connector, threaded members, such as male and female coaxial cable connectors or a threaded probe tip and socket, are used to join the probe tip and the socket together. The threaded connection generally holds the probe tip rigidly, but employs more metal than is used in pliant connectors.

The mechanical requirements for removably coupling metal parts typically increase the use of conductive materials and thereby increase the parasitics of the test probe, which degrades signal fidelity, particularly by decreasing bandwidth. As will be appreciated by one skilled in the art, the probe tip and probe body have a parasitic capacitance and inductance ("parasitics"). The amount of conductive material in the signal path is directly proportional to the magnitude of the parasitic components. In the past, test probe parasitics have not been as significant a problem as they are today. The reason is that test probe parasitics are generally not a significant problem at low frequencies. At the high frequencies (e.g., 6 GHz and higher) that are commonplace in circuits today, even a small increase in parasitic capacitance in the signal path will significantly increase the load placed on the circuit under test. In addition, at high frequencies, the effects of test probe parasitics on signal fidelity significantly increase.

Test probes that have connectors that employ a threaded connection generally have more metal than is used in pliant connectors, thus such connectors have relatively high parasitics. Test probes that have connectors that employ springs or elastomers to join mechanically the probe body with the probe tip have lower (though still high) parasitics. However, the level of parasitics found in spring or elastomer connectors have the additional problem of being variable. As the relative positions and shape of the springs as well as the position of the probe tip change in response to forces encountered by the probe tip, the amount of parasitics also varies. The surface area of the probe tip that is in contact with the socket can also change in response to these forces, changing the parasitics of the probe. It is all but impossible to optimize a test probe design to compensate for variable parasitics.

Yet another general problem with the use of removable tips is the insertion of an additional distance or electrical length that is required for the repeatably removable connector. To avoid distortion, it is especially important to minimize this distance when measuring high frequency signals for which the corresponding wavelengths are not large compared with the electrical length.

In differential test probes, there are two probe tips and two signal paths each of which couples a separate signal to one of two inputs of a differential amplifier. If the differential test probe has removable probe tips that employ spring or elastomer connectors, the connector in each tip adds parasitics that vary with pressure against the respective probe tip. This causes signal fidelity errors that differ for each of the two signal paths. Therefore, there is a signal fidelity error in the differential signal that varies as a result of the respective pressures applied at each connector. As mentioned, it is all but impossible to optimize a test probe design to compensate for variable parasitics.

Accordingly, there is a need for a modular active test probe and removable tip module therefor that optimizes test probe performance.

BRIEF SUMMARY OF THE INVENTION

Disclosed is a modular active test probe and removable tip module therefor. Within the scope of the invention, there is a probe tip module comprising a first probe tip adapted for probing a circuit under test to receive a signal therefrom. The probe tip module includes an amplifier having a first input solidly connected to the probe tip, an output connected to an output connector, and a housing for supporting the probe tip, the amplifier, and the output connector. A probe body is cooperatively adapted with the housing for repeatably removably receiving at least the output connector.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
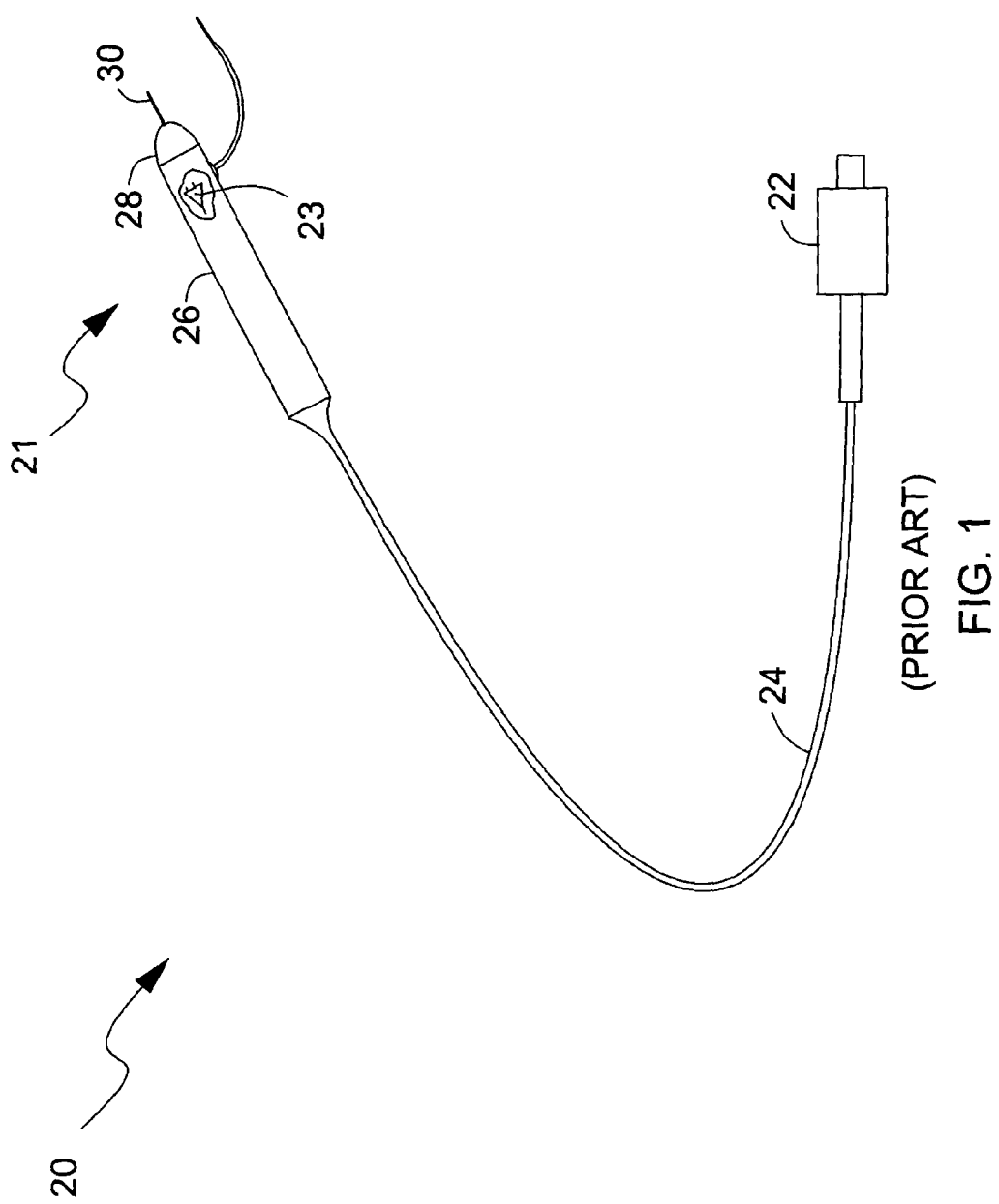
FIG. 1 is a pictorial view of a typical prior art active test probe.
Figure 2:
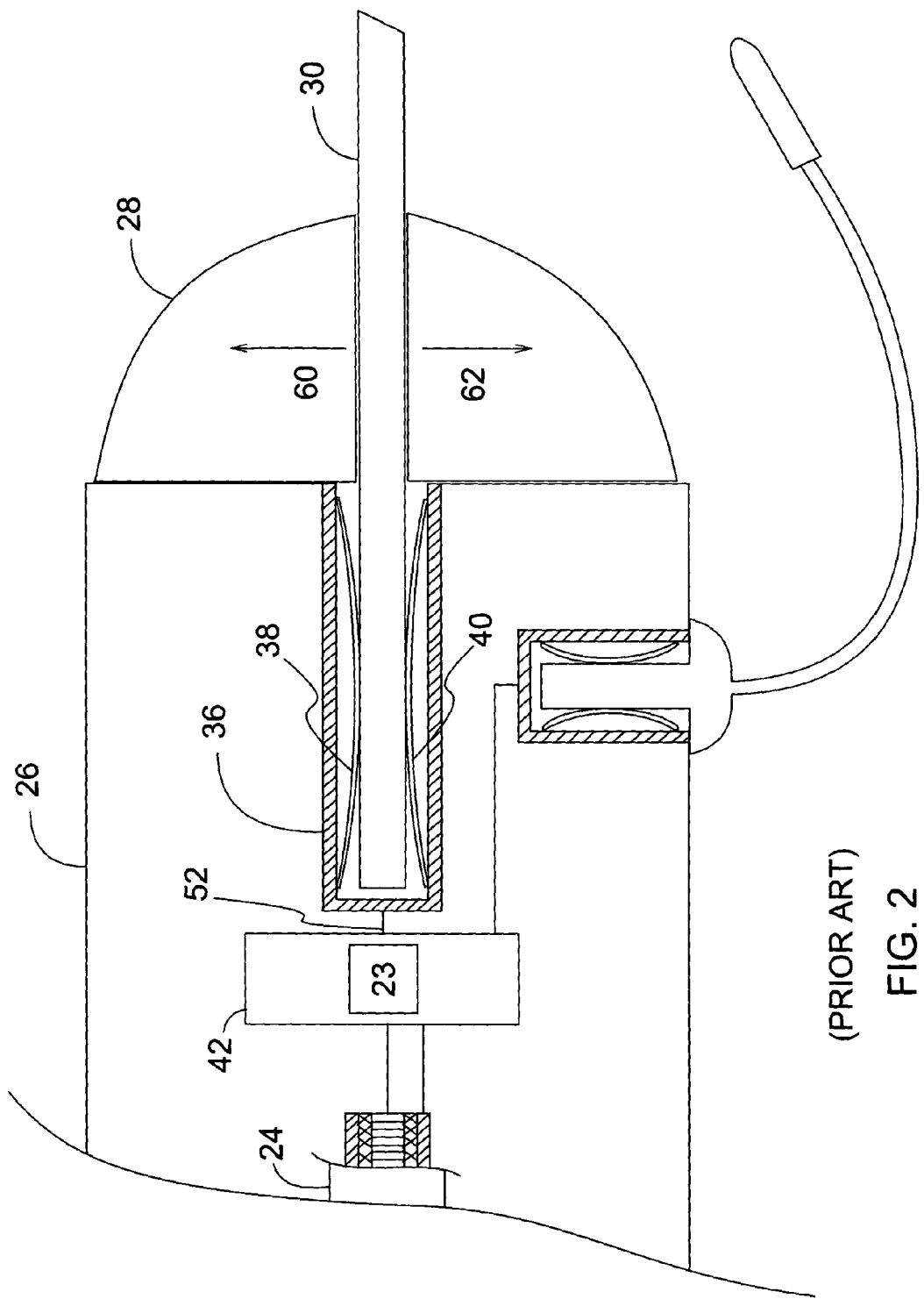
FIG. 2 is a partial sectional view of the prior art active test probe shown in FIG. 1.

As context for the present invention, a typical prior art active test probe 20 is shown in FIGS. 1 and 2. The probe 20 is used, for example, to probe test pins on a circuit board or the leads of an integrated circuit for a signal, and to transmit the signal to a signal measuring or display apparatus ("signal measuring apparatus") such as an oscilloscope. The probe 20 has an elongate, flexible test probe cable 24, typically at least 12" long, to allow convenient access to remote circuits under test. The cable 24 is adapted for repeatably removable mechanical and electrical connection to the signal measuring apparatus at one end, typically at a compensation box 22 that may include compensating circuitry and a power supply and that is adapted to plug into the measuring apparatus via a coax connector.

The other end of the cable 24 is mechanically and electrically connected to a probe end 21, for probing the circuit under test by making intimate contact with the test pins, leads, or other circuit structures. An amplifier 23 for amplifying the signal received from the circuit under test is typically provided in the probe end.

The probe end 21 includes a probe body 26, an end cap 28, and a conductive probe tip 30. The end cap 28 and the probe tip 30 are an integral assembly ("tip assembly"). However, as a desirable feature of some prior art test probes, the tip assembly is adapted to be repeatedly removed from and attached to the probe body 26, meaning that the tip assembly can be removed from and attached to the probe body a large number of times without degrading the performance of the connection.

Referring in addition to FIG. 2, the probe body 26 of the prior art probe 20 includes a compliant connector 36 for removably receiving the probe tip 30. Compliance is provided by springs 38 and 40. The connector 36 is electrically coupled to an electrical circuit 42 that includes the amplifier 23. The connector 36 and the springs 38 and 40 are also typically formed of metal that, as mentioned above, adds to the parasitics and electrical length of the test probe. The probe tip 30 is an elongated electrically conductive member, typically formed of metal.

In FIG. 2, the tip assembly is shown attached to the probe body 26. The tip assembly is held in the attached position by the springs 38 and 40 acting on the probe tip 30. The tip assembly can thereby be repeatedly removed and re-attached to the probe body 26. However, the springs 38 and 40 do not provide a mechanically rigid connection. When the probe tip 30 is pressed against a test point, it can move or wiggle (as indicated by arrows 60, 62) causing the parasitic inductance and capacitance to change as the arrangement or shape of the springs 38 and 40 and as the amount of surface area of the probe tip 30 in contact with the springs 38 and 40 and the connector 36 changes.

The circuit 42 is adapted to compensate for the particular geometry of the probe tip 30. If the probe tip 30 is replaced with a probe tip having a different geometry, the circuit 42 will not optimally compensate the replacement probe tip.

The probe 20 is typically sold as an integral unit with the compensation box 22 at a first end of the cable 24 and the probe end 21 at a second end of the cable 24. The compensation box 22 is generally specifically designed to mate with a particular model plug and socket connector of a testing instrument. Exemplary plug and socket connector systems include, for example, BNC, BMA, SMP, SMA, N-connector, and systems to be developed in the future. The shapes and/or electronic characteristics of the various plug and socket connector systems vary considerably such that a compensation box 22 designed for a first plug and socket connector system would not work with a compensation box 22 designed for a second plug and socket connector system. Some plug and socket connector systems are industry standards and others are proprietary, but they do evolve and change. Because the compensation box 22 is integral with the probe 20, the entire probe, therefore, may only be used with testing instruments that use the associated plug and connector system.

Further, the probe end 21 is generally specifically designed for a particular purpose. For example, the probe end 21 may be a current probe, an active probe, a passive probe, an optic probe, wireless probe, or a type of probe to be developed in the future. (The probe ends may, of course, have various types of integral or replaceable probe tips 30.) Because the probe end 21 is integral with the probe 20, the entire probe (including the compensation box 22) must be changed to reflect the user's intended purpose for the probe 20.

The significance of this is shown if a user has three testing instruments a, b, and c each with a different plug and connector system. If the user desires to have a current probe, an active differential probe, and an optic probe that may be used with each of the testing instruments, the user would be required to purchase nine (9) separate probes 20. At prices ranging between $1,000 and $9,000, this can result in a significant investment.

FIGS. 3–6 show detailed exemplary embodiments or features of the present invention and will be discussed below. The broad concept, however, will be described below in connection with FIG. 7.

Figure 3:
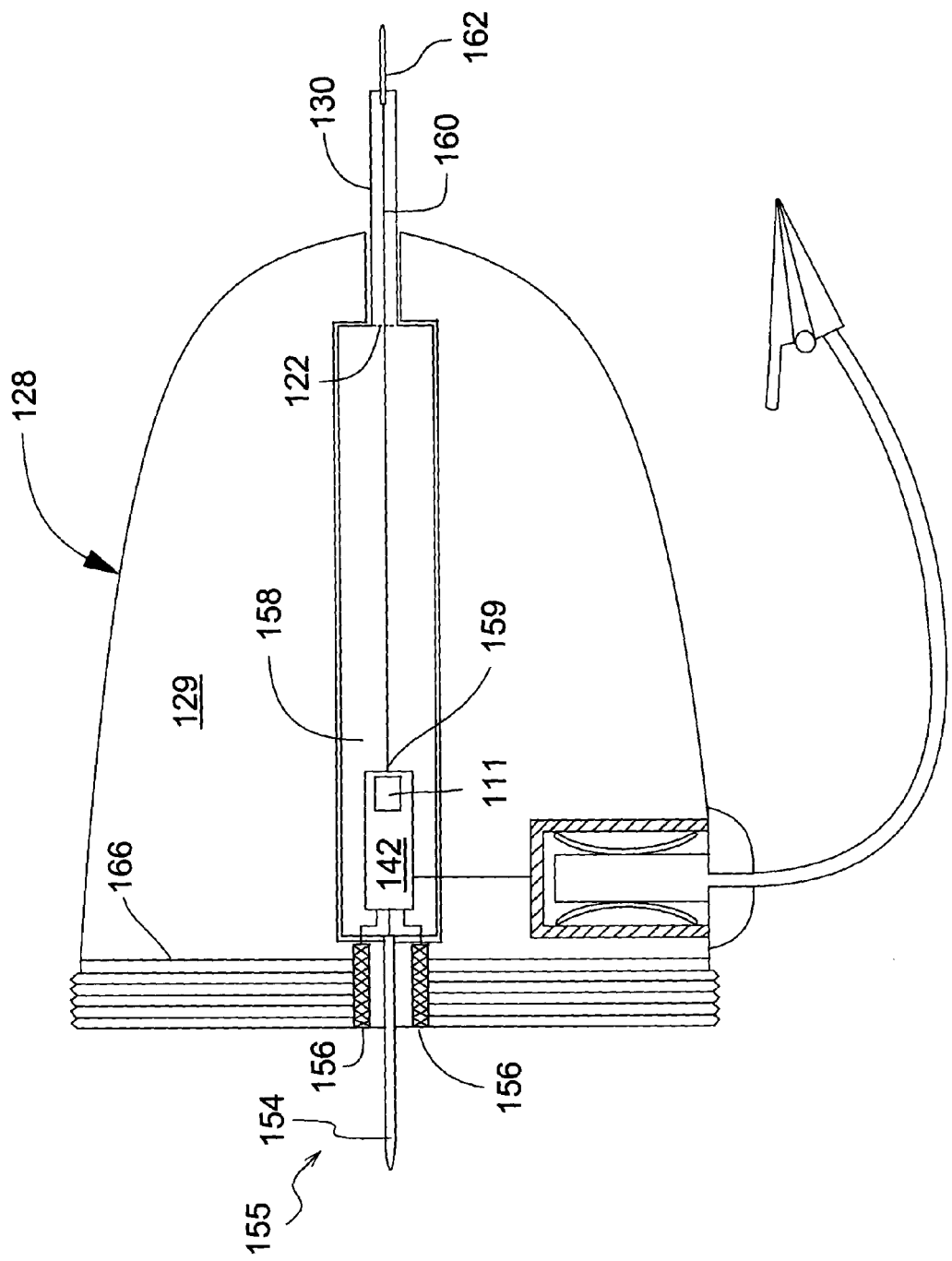
FIG. 3 is a sectional view of a single tip embodiment of a tip module for a modular active test probe according to the present invention.
Figure 4:
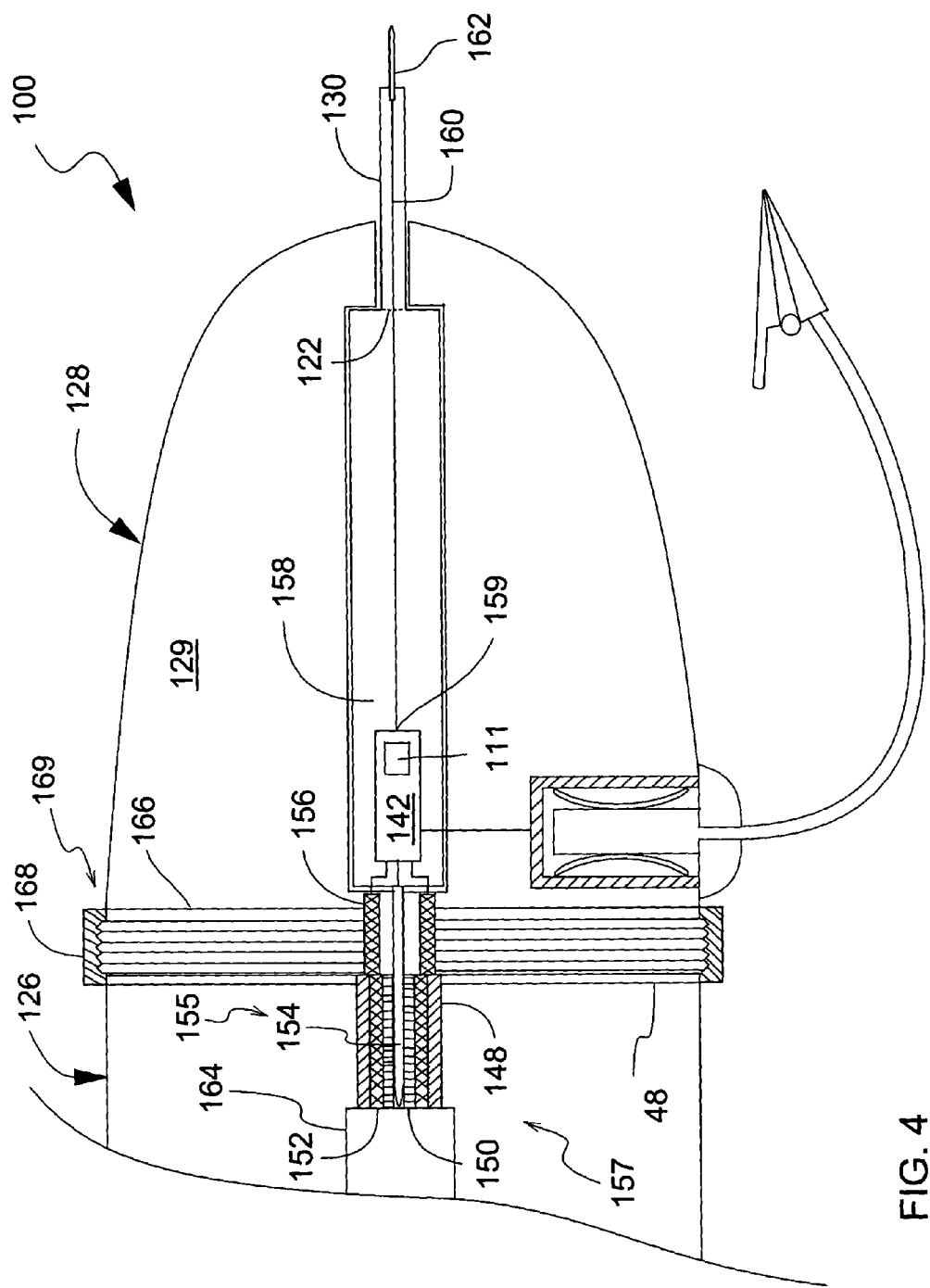
FIG. 4 is a sectional view of the tip module of FIG. 3 attached to a modular active test probe body according to the present invention.

Turning now to FIGS. 3 and 4, a preferred single tip embodiment of a modular active test probe and removable tip module therefor according to the present invention are shown. Particularly, FIG. 3 shows a removable tip module 128 according to the present invention and FIG. 4 shows a modular active test probe 100 having the tip module 128 attached to a test probe body 126.

The removable tip module 128 has a circuit 142 that is adapted to optimize the performance of the test probe 100 for the tip module 128. Importantly, the circuit 142 is provided as part of the tip module 128 so that it may be removably attached to the probe body 126 together with the tip module 128. An outstanding feature of the present invention is that the tip module 128 may be removed from the probe body 126 and replaced with one or more an alternative tip modules, wherein each alternative replacement tip module has unique requirements for compensation as well as a unique circuit 142 adapted to optimize the performance of the test probe for the alternative replacement tip module.

An output of the circuit 142 is provided at a tip module connector 155 for repeatably removable connection of the tip module 128 to the probe body 126. In one preferred embodiment, the module connector 155 is relatively low impedance point, e.g., 50 ohms. The tip module connector 155 comprises an output connector 154 of the tip module 128 and a mating input connector 164 in the probe body 126. This connection may be any type of repeatably removable connection known in the art. In particular, this repeatedly removable connection may be made according to any standard connectors known in the art, such as SSMP and MMCZ connectors as well as connectors yet to be developed. An outstanding feature of the embodiment of the present invention in which the module connector 155 is relatively low impedance point is a reduction in the effect of the parasitics resulting from the connection between the output connector of the tip module and the input connector of the probe body.

In contrast to the connection between the probe body 126 and the tip module 128, the probe tip 162 is not adapted for repeatably removable attachment. In fact, the probe tip 162 cannot be decoupled from the circuit 142 without breaching the connection, such as by cutting or breaking the connection. Such a connection is referred to herein as a "solid" connection. A solid connection between disparate parts may be achieved, e.g., by soldering, welding, joining with an electrically conductive epoxy, or any other method known in the art for forming a solid connection. The solid connection is yet another outstanding feature of the present invention in that, at the input 159, the variable parasitics are eliminated by eliminating the pliancy found in spring and elastomer sockets and the total parasitics are minimized because less conductive material is used than is generally used with connectors. In a preferred embodiment, the circuit 142 includes one or more amplifiers 111 to provide a high impedance input 159. The relatively high impedance of the input provides the advantage of minimally loading the circuit. In this embodiment, it is especially important to minimize parasitic elements and, therefore, the solid connection of the present invention is particularly advantageous.

Preferably, the probe tip 162 is soldered to a circuit board 158 to which the circuit 142 is also solder connected. A signal conductor 160 between the probe tip and the circuit 142 is provided as a trace on the circuit board 158. The circuit board 158 may be formed as is conventional in the art, e.g., of FR4 or polyimide.

The circuit 142 also preferably includes a compensating circuit portion (not shown) to compensate for the parasitics of the tip module. Such circuits are well known in the art; however, they have not heretofore been provided in a tip module adapted to be repeatedly removed from and attached to a probe body. The provision of compensation for the tip module in the tip module ensures that optimum signal fidelity may be achieved for any tip module 128 used with the probe body 126.

Figure 5:
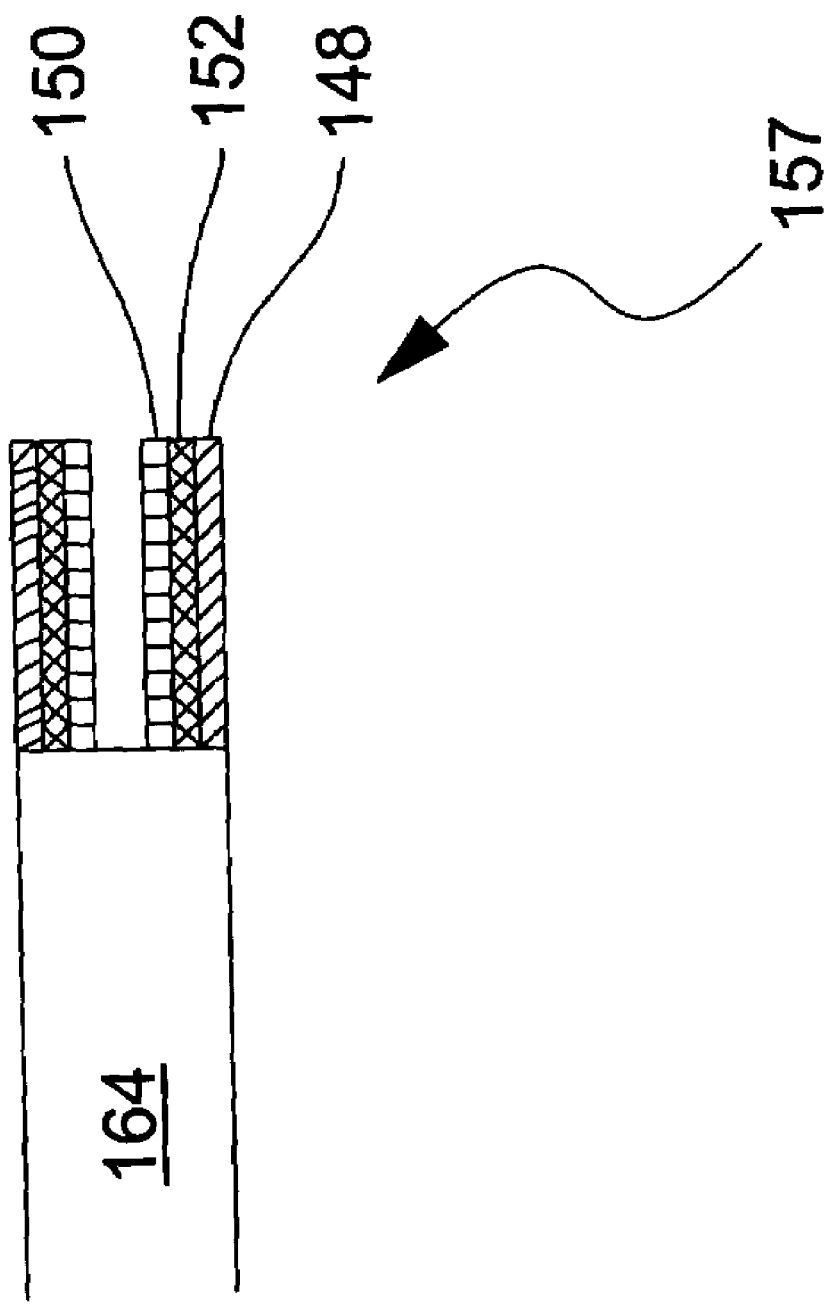
FIG. 5 is a partial sectional view of a connector for the modular active test probe body of FIG. 4.

Preferably, the tip module connector 155 provides high frequency, transmission line characteristics for the output of the circuit 142. In the embodiment of the invention shown, this is accomplished by providing the output connector 154 of the tip module with an elongate metal pin, and the input connector 164 for receiving the output connector 154 with an appropriately terminated coaxial cable as shown in FIG. 5. In that case, the input connector 164 includes an inner conductor 150 for making intimate contact with the connector 154, an outer conductor 148 employed for shielding, and an insulator 152 disposed therebetween. However, it is an outstanding feature of the invention that any other connector configuration may be employed for the tip module connector 155, such as SSMP, BMA, SMB, MMCX, and SSMB and the effect of connection parasitics will be reduced due to the unique features of the tip module.

The tip module 128 includes a housing 129 adapted to hold and support the probe tip 162 and to support or contain the circuit 142, the output connector 154, the circuit board 158, and other desired test module components such as a memory (similar to memory 270 in FIG. 6) for storing, e.g., identifying or parametric information, and calibration circuitry. Preferably, the housing 129 holds the probe tip 130 and the circuit 142 in fixed dispositions relative to the output connector 154. This arrangement advantageously eliminates variable parasitics that would arise if the relative motion between these components were permitted.

In addition, the tip module includes a mechanical connector 169 for mechanically attaching the tip module to the probe body 126. In the example shown, the mechanical connector 169 includes a screw thread 166 for mating with a complementary screw thread 166 on the probe body;

however, a snap fitting or any other means for repeatably removably attaching the tip module 128 to the probe body 126 may be employed.

Figure 6:
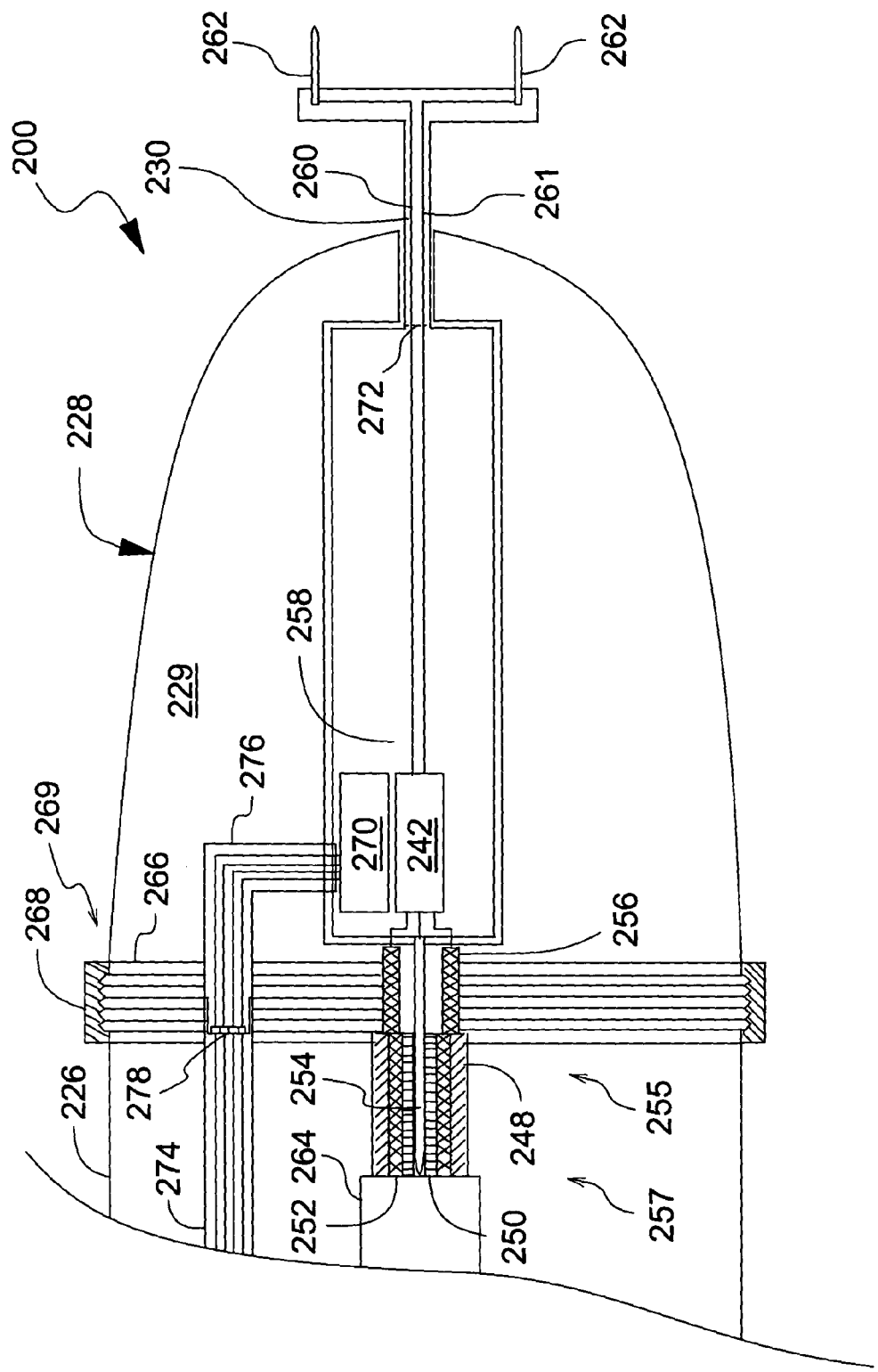
FIG. 6 is a sectional view of a differential embodiment of a modular active test probe and removable tip module therefor according to the present invention.

Turning to FIG. 6, a removable differential tip module 228 according to the present invention is shown attached to a test probe body 226. The test probe body 226 may be identical to the probe body 126 described above. The tip module 228 includes two electrically conductive probe tips 262 coupled to a circuit 242 through respective signal conductors 260 and 261. The circuit 242 includes a differential amplifier for amplifying the signals received via the signal conductors. The circuit 242 transmits a differential signal to a tip module connector 255 that may be constructed identically to the tip module connector 155 described above (e.g. including an output connector 154 that mates with a mating input connector 164 that includes an inner conductor 150, an outer conductor 148, and an insulator 152). The circuit 242 is preferably soldered to a circuit board 258 having traces functioning as the signal conductors 260 and 261. A mechanical connector 269 (e.g. screw threads 266) may also be used for mechanically attaching the tip module 228 to the probe body 226.

The circuit board 258 preferably includes a semi-flexible or bendable portion 230 which may be formed integrally by decreasing the width (in the plane of FIG. 5), or the thickness of the board. The probe tips 262 are soldered to the portion 230. The portion 230 may flex or bend a limited amount with respect to the tips 262 and at the dashed line 272 while minimizing parasitics.

Like the tip module 128 described above, the tip module 228 may include a memory 270 and a communications bus 274 for communicating with the probe body 226. The memory may include information identifying the tip module, or parametric data defining the electrical characteristics of the tip module. Such information may be used by additional circuitry in the probe body, or by the measuring apparatus to which the probe is connected.

The probe tips 262 need not be identical, and the tips 162 and 262 may have any desired shape. Where it is desired to replace a broken or damaged tip, it is an outstanding feature of the invention that the tip module can be replaced without necessitating replacement of the entire probe 200, as is required for active or passive probes employing non-replaceable tips, and without losing the matching provided between the amplifier and the probe tip as in prior art active probes employing replaceable tips.

It may now be appreciated that the present invention provides for a number of advantages, which may be enjoyed separately or in combination. For example, the amount of conductive material is minimized in the critical signal path between the test point and the amplifier input. As mentioned, this is particularly advantageous when measuring high frequency signals. Further, the solid connections in this critical signal path also minimize variation in parasitics as a result of the forces encountered by the probe tip during probing of the circuit. Further, the use of solid connections in this critical signal path ensures that test probe parasitics do not vary as a result of varying the force applied to the probe tip. Still further, circuitry within the tip module is optimized to compensate for the unique parasitics of that specific tip module. Replacing the tip module also replaces the compensation so that optimum signal fidelity is maintained. An additional advantage of the differential embodiment of the invention is that the parasitic inductance and capacitance of each probe tip is matched so that differential signal error is also minimized.

While the removable tip module of the present invention has been described in only terms of a single-ended and differential voltage probe tip module, it should be understood that other embodiments in which the probe tip module may comprise any type of probe tip known in the art are contemplated. For example, it is specifically contemplated that the tip module may be a current probe, an optical probe, or any other type of transducer known in the art. In addition, it is contemplated that the tip module be a standard connector adapted to couple with another standard connector. Further, while the circuit 142, 242 has been described in terms of having compensating circuitry, it will be appreciated that this circuitry is optional. It is contemplated that the amplifier may be designed so that compensation circuitry is unnecessary. Further, it is contemplated that the input to the amplifier may be a transmission line structure as described in U.S. patent application Ser. No. 10/261,829 (entitled Transmission Structure for Electrical Test Probe here), said reference is hereby incorporated by reference in its entirety.

Figure 7:
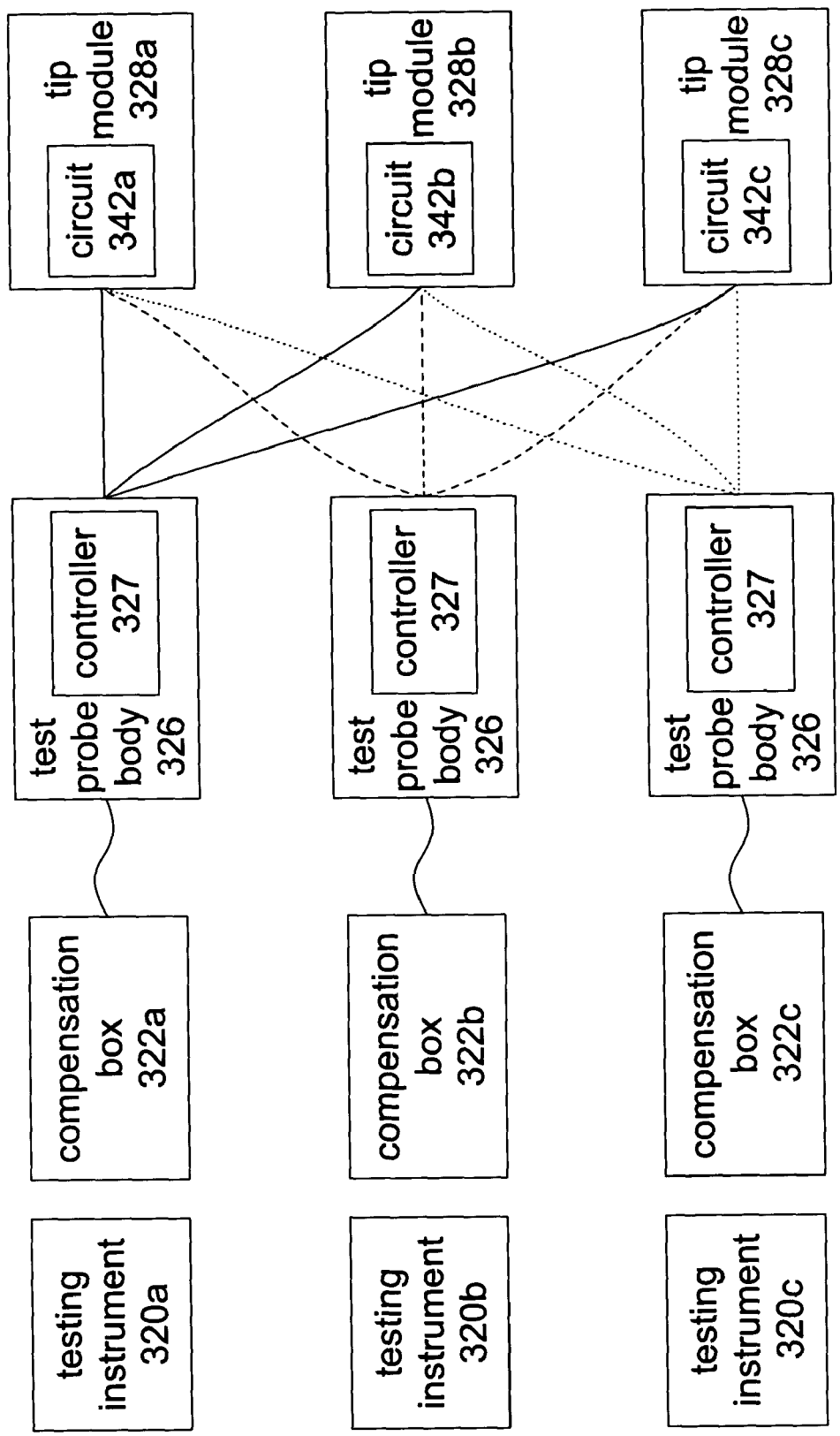
FIG. 7 is a block diagram showing three testing instruments and three different plug and socket connector systems that mate with associated compensation boxes.

The embodiments discussed above are meant to be exemplary and, although certain features are unique in and of themselves, the inventors of the present invention assert that the broad concept shown in FIG. 7 is also unique.

FIG. 7 shows three testing instruments 320a, 320b, and 320c, which, for purposes of this disclosure, are assumed to have three different plug and socket connector systems that mate with the associated compensation box 322a, 322b, and 322c. Each compensation box 322a, 322b, and 322c is attached via a cable or other connection means to a test probe body 326 having a controller 327 therein. It should be noted that although shown as a single embodiment of a test probe body 326, it is possible that there are alternative or multiple types of test probe bodies. Similarly, it should be noted that although shown as a single embodiment of a controller 327, it is possible that there are alternative or multiple types of controllers. The controller 327 may be individually programmed to provide information about the compensation box 322a, 322b, and 322c, cable, and/or test probe body 326. The controller 327, however, is designed to communicate with and obtain information from the circuit 342a, 342b, or 342c of the respective tip modules 328a, 328b, and 328c. It should be noted that although shown as three separate circuits 342a, 342b, 342c, it is possible that the circuits 342a, 342b, 342c are identical, but programmed differently to reflect the specific characteristics of the respective tip modules 328a, 328b, and 328c. As shown by the lead lines, any of the tip modules 328a, 328b, 328c may be connected to any of the compensation box/test probe body combinations (or platforms) 322a/326, 322b/326, and 322c/326.

The significance of this is shown if a user has three testing instruments 320a, 320b, and 320c and the user desires to have a current probe tip module 328a, an active differential probe tip module 328b, and an optic probe tip module 328c that may be used with each of the testing instruments. In this case, instead of being required to purchase nine (9) separate probes 20, the user could produce exactly what he needs: three compensation box/test probe body platforms 322a/326, 322b/326, 322c/326, a current probe tip module 328a, an active differential probe tip module 328b, and an optic probe tip module 328c. Further, if the user purchases a fourth testing instrument, he would only need to purchase an associated compensation box/test probe body platform and he could still use the current probe tip module 328a, active differential probe tip module 328b, and optic probe tip module 328c. Similarly, a new tip module could be used with any of the compensation box/test probe body platforms 322a/326, 322b/326, 322c/326.

In one preferred embodiment, the compensation box/test probe body combinations (or platforms) have the ability to enhance or add features to the testing instrument and/or the tip modules. For example, older generation testing instruments would not be able to turn off a tip module that was overheating. However, the platform can be implemented to include this feature. Using the platforms the tip modules can be updated to include new features.

The features discussed in connection with FIG. 7 are also shown and described in connection with FIGS. 3–6. For example, as discussed above, "an outstanding feature of the present invention is that the tip module 128 may be removed from the probe body 126 and replaced with one or more an alternative tip modules, wherein each alternative replacement tip module has unique requirements for compensation as well as a unique circuit 142 adapted to optimize the performance of the test probe for the alternative replacement tip module."

Based on the information present in this specification, it can be seen that one advantage of the present invention is the forward and backward compatibility without having to purchase all new equipment. Further, by changing tip modules 328a, 328b, and 328c, any type of signal may be measured with any testing instrument 320a, 320b, 320c. Still further, because of the modular configuration, the controller 327 and/or circuit 342a, 342b, 342c may be implemented as firmware that may be easily updated (perhaps even as a software upgrade). The present invention also offers better signal characteristics, a smaller product, and other advantages discussed throughout this disclosure.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A modular active test probe for probing a circuit and transmitting at least one signal therefrom to a signal measuring apparatus, comprising:
   (a) a probe tip module comprising a first probe tip adapted for probing the circuit to receive a first signal, an amplifier having an input having a first impedance solidly connected to said probe tip, an output having a second impedance connected to an output connector, and a housing for supporting said probe tip, said amplifier, and said output connector; and
   (b) a probe body cooperatively adapted with said housing for repeatably removably receiving said output connector.

2. The test probe of claim 1, wherein said first impedance is a high impedance in comparison with the output impedance of a test point in the circuit where said first signal is sampled.

3. The test probe of claim 1, further comprising an elongate, flexible test probe cable adapted for mechanical connection to said probe body, repeatably removable mechanical and electrical connection to the signal measuring apparatus, and electrical connection between said output connector and the signal measuring apparatus.

4. The test probe of claim 3, wherein said second impedance is a relatively low impedance and is matched with the impedance of said test probe cable.

5. The test probe of claim 1, wherein said probe body is cooperatively adapted with said housing for mechanically repeatably removably receiving said housing.

6. The test probe of claim 5, wherein said housing includes screw threads for mechanically repeatably removably receiving said housing.

7. The test probe of claim 1, further comprising a circuit board to which said amplifier is solder connected.

8. The test probe of claim 7, wherein said probe tip is solder connected to said circuit board.

9. The test probe of claim 8, wherein said circuit board includes a trace for conducting the signal from said probe tip to said amplifier.

10. The test probe of claim 1, further comprising a compensating circuit adapted to compensate for selected electrical characteristics of said tip module.

11. The test probe of claim 1, further comprising a compensating circuit adapted to compensate for selected electrical characteristics of said tip module.

12. The test probe of claim 1, comprising a second probe tip mechanically adapted for probing the circuit to receive a second signal, wherein said amplifier includes a second input solidly connected to said second probe tip, said second input having a third impedance, and wherein said amplifier is adapted to provide a differential signal derived from said first and second inputs on said output.

13. The test probe of claim 12, further comprising a compensating circuit adapted to compensate for selected electrical characteristics of said tip module.

14. The test probe of claim 12, wherein said compensating circuit is adapted to compensate for selected electrical characteristics of each said first and second probe tips.

15. The test probe of claim 12, further comprising a circuit board having a bendable portion, wherein said amplifier is solder connected to said circuit board and said first and second probe tips are solder connected said bendable portion of said circuit board.

16. The test probe of claim 15, wherein said circuit board includes a first trace for conducting said first signal from said first probe tip to said amplifier and a second trace for conducting said second signal from said second probe tip to said amplifier.

17. The test probe of claim 16, wherein said first trace comprises a first transmission line and said second trace comprises a second transmission line.

18. The test probe of claim 1, wherein said first probe tip is adapted to measure a current signal.

19. The test probe of claim 1, wherein said first probe tip is adapted to measure an optical signal.

20. The test probe of claim 1, wherein said first probe tip is adapted to couple with a connector.

21. The test probe of claim 1, wherein said probe tip module includes a memory.

22. The test probe of claim 1, wherein said test probe is used for providing a functional connection between said signal measuring apparatus and said circuit and transmitting at least one signal therebetween, each signal measuring apparatus having a specific signal measuring apparatus connection scheme, said test probe further comprising:
   (a) a compensation box functionally interconnected to said probe body;
   (b) said compensation box having a compensation box connection scheme adapted to mate with an associated signal measuring apparatus connection scheme such that said compensation box is configured to mate with an associated signal measuring apparatus;

(c) said probe tip module having an identification circuit suitable for providing identification data signals regarding the probe tip module in which identification circuit is positioned; and
(d) said probe body having a controller suitable for communicating with said identification circuit and said signal measuring apparatus;
(e) wherein said signal measuring apparatus may be connected to an associated probe body which may be connected to any said at least one probe tip module.

23. The test probe of claim 22 further comprising:
(a) a plurality of signal measuring apparatus;
(b) a plurality of probe bodies, each probe body associated with a respective one of said plurality of signal measuring apparatus; and
(c) a probe tip module, said probe tip module interconnectable with any of said plurality of probe bodies.

24. The test probe of claim 22 further comprising:
(a) a single signal measuring apparatus;
(b) a probe body associated with said single signal measuring apparatus; and
(c) a plurality of probe tip modules, each of said plurality of probe tip modules interconnectable with said probe body.

25. The test probe of claim 1, wherein signal measuring apparatus is a testing instrument.

26. A modular active test probe for probing a circuit and transmitting at least one signal therefrom to a signal measuring apparatus, said test probe comprising:
(a) a probe tip module comprising
   (i) a first probe tip adapted for probing the circuit to receive a first signal;
   (ii) an amplifier having an input having a first impedance and an output having a second impedance;
   (iii) said amplifier input solidly connected to said probe tip to form a solid connection therebetween;
   (iv) said amplifier output connected to an output connector; and
   (v) a housing for supporting said probe tip, said amplifier, and said output connector; and
(b) a probe body cooperatively having an input connector for repeatably removably receiving said output connector to form a repeatably removable connection therebetween.

* * * * *